(12) United States Patent
Nishii et al.

(10) Patent No.: US 7,356,916 B2
(45) Date of Patent: Apr. 15, 2008

(54) CIRCUIT-FORMED SUBSTRATE AND METHOD OF MANUFACTURING CIRCUIT-FORMED SUBSTRATE

(75) Inventors: Toshihiro Nishii, Osaka (JP); Yasuharu Fukui, Osaka (JP); Kiyohide Tatsumi, Nara (JP); Yoshihiro Kawakita, Osaka (JP); Shinji Nakamura, Osaka (JP); Hideaki Komoda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 288 days.

(21) Appl. No.: 10/362,448

(22) PCT Filed: Jul. 16, 2002

(86) PCT No.: PCT/JP02/07217

§ 371 (c)(1),
(2), (4) Date: Jul. 29, 2003

(87) PCT Pub. No.: WO03/009656

PCT Pub. Date: Jan. 30, 2003

(65) Prior Publication Data
US 2004/0058136 A1    Mar. 25, 2004

(30) Foreign Application Priority Data
Jul. 18, 2001    (JP) .............................. 2001-217775

(51) Int. Cl.
*H05K 3/36*    (2006.01)

(52) U.S. Cl. .......................... 29/830; 174/262; 428/901
(58) Field of Classification Search ................ 174/250, 174/255, 262–266; 428/901; 361/780, 792–795; 29/830, 831, 846, 847
See application file for complete search history.

(56) References Cited

U.S. PATENT DOCUMENTS 4,241,132 A * 12/1980 Pratt et al. ................... 442/376
5,346,750 A    9/1994 Hatakeyama et al.

(Continued)

FOREIGN PATENT DOCUMENTS

JP    5-198907    8/1993

(Continued)

OTHER PUBLICATIONS

"Remarkable Development Trend of Buildup Multilayer PWB" by Kiyoshi Takagi, Surface-Mount Technology, published by The Nikkan Kogyo Shimbun, Ltd., 1997, pp. 2-10, with partial English translation.

*Primary Examiner*—Jeremy C Norris
(74) *Attorney, Agent, or Firm*—Wenderoth, Lind & Ponack, L.L.P.

(57) ABSTRACT

A circuit board with reliable electrical connections is provided. An insulated board material, having connections for connecting a layer to another layer, includes a reinforcing member. A thickness of the entire insulated board material is at least equal to and not more than 1.5 times of a thickness of the reinforcing member.

4 Claims, 4 Drawing Sheets

U.S. PATENT DOCUMENTS

| | | | |
|---|---|---|---|
| 5,484,647 A | 1/1996 | Nakatani et al. | |
| 5,888,627 A * | 3/1999 | Nakatani | 428/209 |
| 6,096,411 A * | 8/2000 | Nakatani et al. | 428/209 |
| 6,479,760 B2 * | 11/2002 | Kimbara et al. | 174/260 |
| 6,523,258 B2 * | 2/2003 | Kawamoto et al. | 29/852 |
| 6,645,607 B2 * | 11/2003 | Curcio et al. | 428/209 |
| 6,698,093 B2 * | 3/2004 | Nishii | 29/852 |
| 2004/0170795 A1 * | 9/2004 | Haas et al. | 428/41.8 |

FOREIGN PATENT DOCUMENTS

| | | |
|---|---|---|
| JP | 7-249868 | 9/1995 |
| JP | 7-266435 | 10/1995 |
| JP | 9-321430 | 12/1997 |
| JP | 11-163537 | 6/1999 |
| JP | 2000-156566 | 6/2000 |
| JP | 2000-174404 | 6/2000 |
| JP | 2001-102708 | 4/2001 |
| JP | 2001-127389 | 5/2001 |
| WO | 96/09158 | 3/1996 |
| WO | 01/39561 | 5/2001 |

\* cited by examiner

CIRCUIT-FORMED SUBSTRATE AND METHOD OF MANUFACTURING CIRCUIT-FORMED SUBSTRATE

TECHNICAL FIELD

The present invention relates to circuit boards used in various electronic apparatuses, it also relates to methods of manufacturing the same circuit boards.

BACKGROUND ART

Electronic apparatuses have been downsized and become denser in packaging. This market trend involves circuit-forming boards, to which electronic components are to be mounted, to be double-sided boards, or multilayer boards. As such, higher density boards that can accommodate more circuits and more components are developed. (e.g., Refer to "Surface Mounting Technique" January 1997, published by Daily Industry Newspaper Inc. in Japan. This edition includes a paper titled "Remarkable Development of Build-up Multi-layer PWB" written by Mr. Kiyoshi Takagi.)

Prior art is described hereinafter with reference to FIGS. 3A-3G and FIG. 4. Board material 1 shown in FIG. 3A is so called prepreg that is formed by the following method: Woven fabric, as a reinforcing member to be used in circuit boards, is impregnated with thermosetting epoxy resin and turned into a status called stage B. Board material 1 is coated with film 2 on both the upper and rear faces by a laminating method using a heated roll.

Next, as shown in FIG. 3B, via holes 3 are formed through board material 1 with a laser-beam, then via holes 3 are filled with conductive paste 4 produced by mixing conductive particles such as copper powder with thermosetting resin, curing agent, and solvent. Board material 1 thus becomes as shown in FIG. 3C. Films 2 are peeled off from both the faces, so that conductive paste 4 protrudes as shown in FIG. 3D. Above both the faces of material 1, copper foils 5 are prepared, and hot-pressed by a hot-presser (not shown), so that material 1 is thermally cured as shown in FIG. 3E, and conductive paste 4 is compressed, thereby connecting copper foil 5 on the upper face to that on the rear face. At this time, the epoxy resin impregnated in material 1 flows outside and forms flow-out section 6. Surplus portions on both the ends of material 1 are cut off, so that the shape shown in FIG. 3F is formed. Then copper foils 5 are processed into desired patterns by etching or other methods to form circuit 7, and finally, the double-sided circuit board as shown in FIG. 3G is obtained.

The foregoing method of manufacturing the circuit boards, however, sometimes results in instability of electrical connections with conductive paste between an upper-face circuit and a rear-face circuit of the circuit board as well as between an upper-face circuit and an inner circuit in the case of multi-layer circuit boards.

The inventors have analyzed circuit boards manufactured or made on a trial basis in order to investigate the causes of the instability discussed above. The results show that conductive particles in conductive paste 4 flow out from via holes 3 and become flow-out particles 8 as shown in FIG. 3E.

In other words, conductive paste 4 should be compressed vertically in FIG. 3 so that conductive particles in paste 4 contact with each other efficiently and firmly, and also contact with copper foil 5 firmly. However, in the process between FIG. 3D and FIG. 3E, flow-out section 6 is formed, so that thermosetting resin in board material 1 flows toward outer open ends during the heat and compression. At that time, the conductive particles in conductive paste 4 are pushed by the flowing thermosetting resin, and the particles flow laterally, as shown in FIGS. 3E-3G. As a result, conductive paste 4 is not efficiently compressed, so that the electrical connections with conductive paste 4 become unstable. The foregoing description refers to the board material made of glass woven fabric and thermosetting resin. However, failures are also observed when other materials are used, such as inorganic fiber other than glass, or organic fiber such as aramid fiber, or a reinforcing member made of non-woven fabric.

When woven fabric is used among others, flow resistance becomes small due to the structure using the woven fabric. Thus the thermosetting resin becomes so fluid that the conductive paste cannot achieve the electrical connection.

The inventors have carried out various experiments and analyzed areas around the via holes having insufficient electrical connections. The results show that flow-out particles as shown in FIG. 3E are observed more on the upper face than the rear (bottom) face of board material 1. The inventors have investigated the causes of this status, and reached the following conclusion.

In the case where prepreg employing the woven fabric made of glass fiber is used as the board material, the board material has the sectional view as shown in FIG. 4. In other words, board material 1 is manufactured by the following steps:

thermosetting resin such as varnish-state epoxy resin is impregnated as impregnating resin 10 into glass-fiber woven fabric 9;

resin 10 is rolled with a roller so that material 1 has a desired thickness; and board material 1 is dried and turned into stage B.

Therefore, the thickness of board material 1 is a thickness of initial glass-fiber woven fabric 9 plus a thickness of impregnating resin 10 formed on the surface of woven fabric 9. The layer of impregnating resin 10 formed on the surface flows fiercely during the step of applying heat & pressing in manufacturing the circuit boards discussed previously. Then numerous flow-out particles occur around the surface of board material 1 and, as a result, connections between layers with conductive paste 4 become insufficient.

In the case where regular prepreg is used as the material of circuit boards, the prepreg is completely cured by heating and pressing, i.e., the prepreg is turned into stage C. Then the prepreg is pierced with a drill before being plated with a metal such as copper. As a result, layer-to-layer connection is achieved. Thus there is no such a problem as discussed above. Recently a manufacturing method of high-density circuit-forming boards has been developed. In this method, conductive material, namely, conductive paste is filled into via holes formed in board material in stage B so that connection between layers may be achieved. In this method the foregoing problem has occurred.

A variety of thicknesses are required design-wise to insulate respective layers of a circuit board from each other; however, the reinforcing members to be used in prepreg have a limited number of thicknesses. This present situation obliges some manufacturers to use the board materials with the impregnating resin 10, shown in FIG. 4, being in a layer that is rather thick.

DISCLOSURE OF THE INVENTION

Through numerous experiments and analyses of samples, the inventors have found that maintaining the following thickness ratio at an appropriate level is crucial to solve the problem discussed previously. The thickness ratio is a thickness of a section of which the major component is impregnated resin disposed on and beneath the reinforcing member, namely, disposed near the surface of the board material, vs. a thickness of a center section, where the impregnated resin is merged with the reinforcing member, of the board material. In other words, if the thickness ratio is not appropriate, connecting means between layers, such as conductive particles, would flow out around the surface of the board material during the step of applying heat & pressing due to flow-out of the board material component.

The method of the present invention for manufacturing the circuit boards uses the board material in stage B, which includes woven fabric, non-woven fabric, or mixed material of those two as a reinforcing member. The board material in stage B that has undergone a molding process is modified to have a thickness not less than the thickness of the reinforcing member and not more than 1.5 times that of the reinforcing member.

The reinforcing member among the materials for the circuit board of the present invention takes not less than 30% and not more than 60% in total weight, or the thickness of the reinforcing member takes not less than 50% and not more than 90% out of the thickness of the board material.

The present invention allows the connecting means, such as conductive paste, for realizing connections between layers to achieve the connections efficiently.

As a result, the present invention can increase the reliability in electrical connection with conductive paste disposed between layers, and provide quality circuit-forming boards of higher density.

DETAILED DESCRIPTION OF THE PREFERRED EMBODIMENTS

The present invention includes a step of layering at least two kinds of metallic foils and board materials into a layered body. One of the at least two is selected from the group consisting of metal foil, metal foil affixed to a supporter, and metal foil affixed to the supporter and formed with a circuit pattern. The other one includes at least one board material in stage B selected from the group consisting of (a) a board material in stage B and having connecting means for connecting a layer to another layer, (b) a board material in stage B and having a circuit pattern or metal foil and the connecting means, and (c) one of a board material in stage C having a circuit or metal foil, or a board material in stage C having a circuit or metal foil and the connecting means.

The step of layering includes a step of applying heat and pressing. The board material in stage B includes woven fabric, non-woven fabric, or mixed material of those two fabrics as a reinforcing member, and this board material undergoes a molding step of heating & pressing, so that a thickness thereof in stage B becomes at least equal to and not more than 1.5 times of a thickness of the reinforcing member.

A method of manufacturing the circuit board includes a step of applying heat & pressing, where electrical connections between layers can be achieved efficiently with layer-to-layer connecting means.

The method of manufacturing the circuit board uses conductive material filled in via holes or non-via holes as the layer-to-layer connecting means, the via holes or the non-via-holes being provided to the board material in stage B. The conductive material is compressed efficiently during the molding step of applying heat & pressing, so that a layer-to-layer connection with a lower resistance is obtainable.

Exemplary embodiments of the present invention are demonstrated hereinafter with reference to FIGS. 1A-1G and FIGS. 2A-2E.

Exemplary Embodiment 1

Figure 1A:
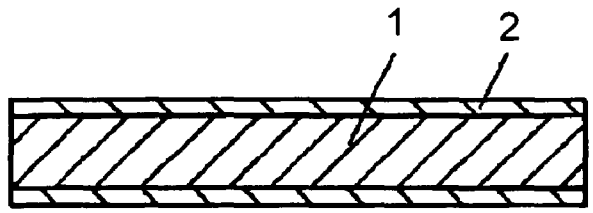
FIGS. 1A-FIG. 1G show sectional views illustrating a method of manufacturing a circuit-forming board in accordance with a first exemplary embodiment of the present invention.

FIGS. 1A-FIG. 1G show sectional views illustrating a manufacturing method and materials of a circuit-forming board in accordance with the first exemplary embodiment of the present invention. As shown in FIG. 1A, film 2 of 20 µm thickness adheres to both the faces of board material 1, which is prepreg using woven fabric made of glass fiber. To express a thickness of the glass-fiber woven fabric as a reinforcing member, a nominal thickness that is often used to express a thickness is used.

Film 2 uses polyethylene terephthalate (PET) of 20 µm thickness; however, thermosetting resin such as epoxy resin can be coated on the board material as film 2 instead of using the PET film.

Figure 1B:
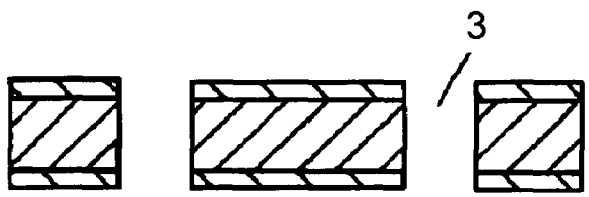

Next, as shown in FIG. 1B, board material 1 is pierced with a carbon dioxide gas laser, thereby forming via holes of approx. 200 µm across.

Figure 1C:
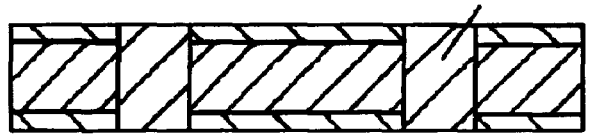

Then as shown in FIG. 1C, via holes 3 are filled with conductive paste 4 by a screen printing method. Conductive paste 4 is made by mixing copper powder having approx. 5 g m diameter with thermosetting resin and a curing agent. Solvent can be added to paste 4 in order to adjust the viscosity.

Figure 1D:
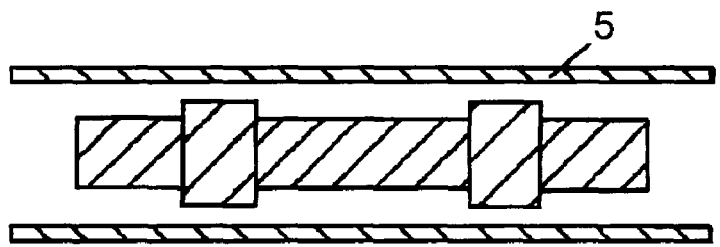

Next, as shown in FIG. 1D, film 2 on both faces of board material 1 is peeled off, so that conductive paste 4 projects from material 1 by the thickness corresponding to the thickness of film 2. Then copper foil 5 is placed on both the faces of material 1.

Figure 1E:
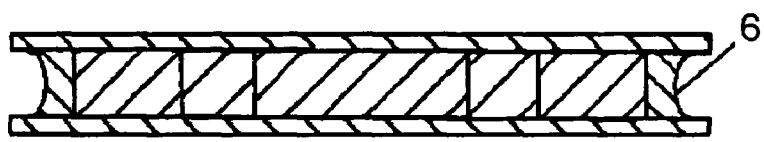

Then board material 1 undergoes the step of applying heat & pressing, where heat and pressing are applied to material 1 in a thickness direction of material 1, so that material 1 obtains the shape as shown in FIG. 1E. At this time, the thermosetting resin in material 1 flows out and forms flow-out section 6.

Figure 1F:
Figure 1G:
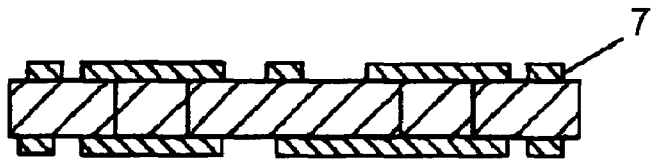

Next, as shown in FIG. 1F, a periphery of board material 1 is cut so that material 1 becomes a desirable size, and copper foil 5 is etched to form circuit 7. As a result, the double-sided circuit board as shown in FIG. 1G is obtained.

In the case of manufacturing the double-sided circuit boards through the steps discussed above, the inventors have tested various board materials and conditions of the step of applying heat & pressing in order to solve the problems of insufficient electrical connection due to flowing out of conductive particles from conductive paste 4.

Plain weave glass-fiber fabrics of 60, 80, and 100 μm thick are prepared as reinforcing members. Those fabrics are generally used for ordinary printed circuit boards. An amount of thermosetting resin to be impregnated into the reinforcing members is expressed in a weight ratio. The resin impregnated is put in a dryer and turned into stage B, so that prepreg is produced. A thickness of the board after the step of heat & pressing is measured, and a ratio of this thickness vs. a thickness of glass-fiber woven cloth is calculated. A test pattern is formed on both the faces of the double-sided board produced. This test pattern has 500 layer-to-layer connections in series through the via holes of 200 μm across. Then the circuit electrical resistance is measured, and a connection resistance, i.e., an electrical resistance between an upper face and a rear face per layer-to-layer connection is averaged out, and the resulting resistance value is referred to as a via-resistance value. The result of the preparations discussed above is summarized in the following Table 1.

TABLE 1

| No. | Thickness of glass-fiber woven fabric T1 (μm) | Thickness of prepreg (μm) | Thickness of board material after heat & press T2 (μm) | Thickness ratio T2/T1 | Via-Resistance value (mΩ) |
|---|---|---|---|---|---|
| 1 | 60 | 94 | 70 | 1.17 | 3 |
| 2 | 60 | 112 | 95 | 1.58 | 30 |
| 3 | 60 | 133 | 115 | 1.92 | large depression |
| 4 | 80 | 120 | 105 | 1.31 | 3.8 |
| 5 | 100 | 165 | 125 | 1.25 | 4.5 |
| 6 | 100 | 185 | 155 | 1.55 | 120 |

As Table 1 shows, when thickness T2 of board material 1 which has undergone the step of heat & pressing is not more than 1.5 times of thickness T1 of glass-fiber woven fabric, the via-resistance becomes stable.

The sample of test No. 1 shows that although the via-resistance is low, a peel withstanding strength of copper foil 5 from board material 1 decreases to a lower level than a normal one. Thus if this sample is used in an application where a particular peel strength is required, an amount of resin is preferably added in order to increase the weight ratio from 66% to 67-68%. The sample of test No. 2 shows that the via-resistance increases when the sample undergoes a storage reliability test in a condition of high-temperature and high-humidity. The foregoing experiment finds that the via-resistance is preferably not more than 10 m Ω. Thus it is concluded that the thickness of the board after the heating & pressing preferably measures such that the ratio of T2/T1 becomes not more than 1.5.

As the thickness of board material 1 in the status shown in FIG. 1E becomes thinner after the pressing, the electrical connection becomes better. On the other hand, the experiment finds that board material 1 after the pressing needs at least the thickness of the reinforcing member because of the following reasons: (a) peel withstanding strength, (b) moldability in the step of heating & pressing, and (c) necessity of absorbing bumps and dips due to circuits on inner layers in the case of manufacturing multi-layer circuit boards.

If thickness T2 (the thickness after the pressing) becomes thinner than necessary, fibers in the reinforcing member touch the copper foil, and the touch tends to cause copper migration. This is taught by the reliability test of the samples.

The experiments also show that the following conditions are effective to obtain an appropriate thickness T2:(a) a ratio of the reinforcing member in the board material preferably ranges from not less than 30% to not more than 60% in weight ratio; (b) a thickness of board material 1 in the status shown in FIG. 1A is set at the multiple from 1.1 to 2 of a thickness of the reinforcing member, namely, the thickness of the reinforcing material is adjusted to range from 50% to 90% that of board material 1.

Exemplary Embodiment 2

Figure 2A:
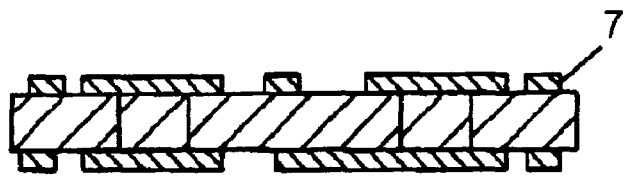
FIGS. 2A-FIG. 2E show sectional views illustrating a method of manufacturing a circuit-forming board in accordance with a second exemplary embodiment of the present invention.
Figure 2B:
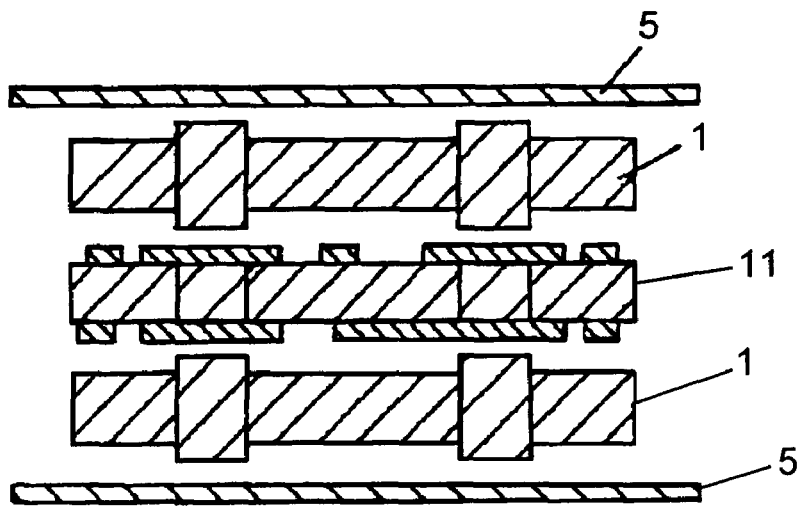
Figure 2C:
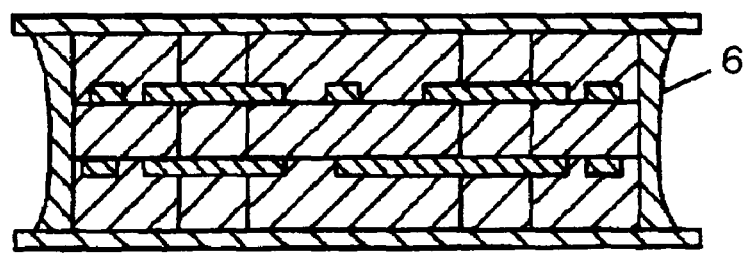

The first embodiment refers to the double-sided circuit board, and this second exemplary embodiment describes the case of manufacturing multilayer circuit boards. First, prepare double-sided circuit board 11 as shown in FIG. 2A, and place copper foil 5 and board material 1 filled with conductive paste 4 on both the faces of board 11 matching the corresponding positions with each other. Then apply heat and pressing with a heating & pressing machine, thereby molding and curing board material 1 as shown in FIG. 2C. At this time, a flow-out component of material 1 forms flow-out section 6.

Figure 2D:
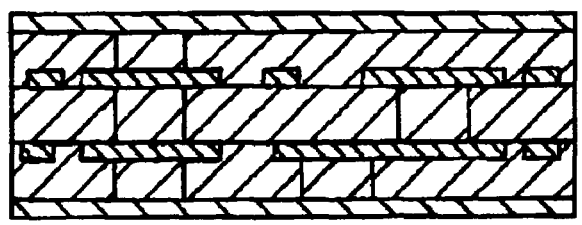
Figure 2E:
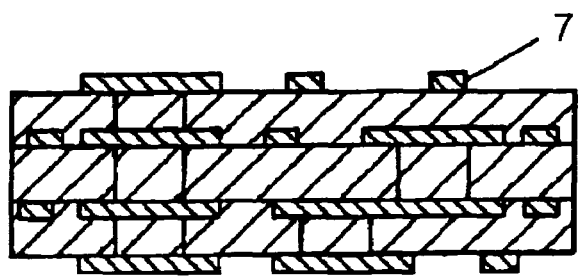
Figure 3A:
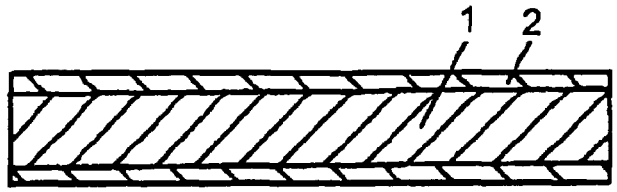
FIGS. 3A-FIG. 3G show sectional views illustrating a method of manufacturing a circuit-forming board in accordance with a first prior art method.
Figure 3B:
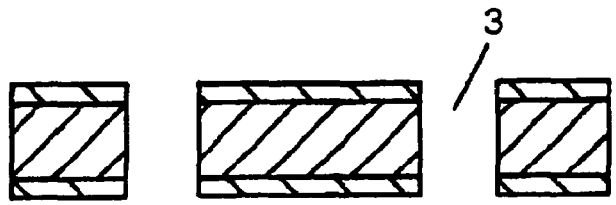
Figure 3C:
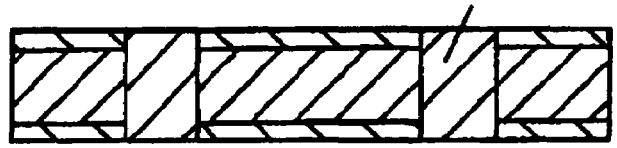
Figure 3D:
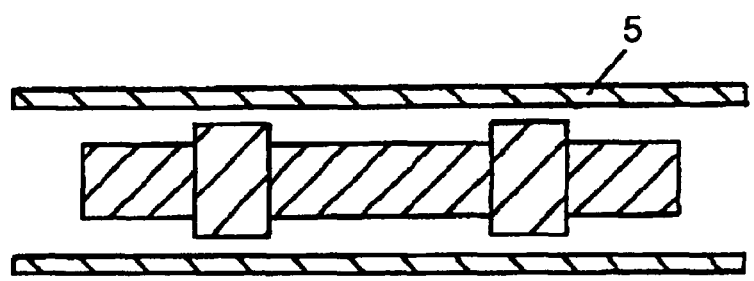
Figure 3E:
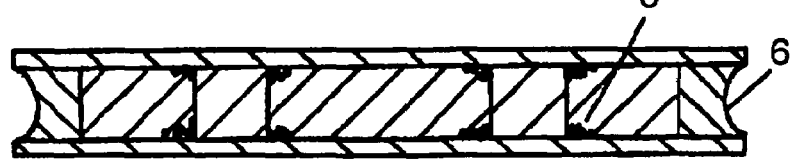
Figure 3F:
Figure 3G:
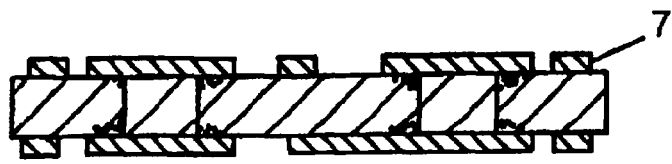
Figure 4:
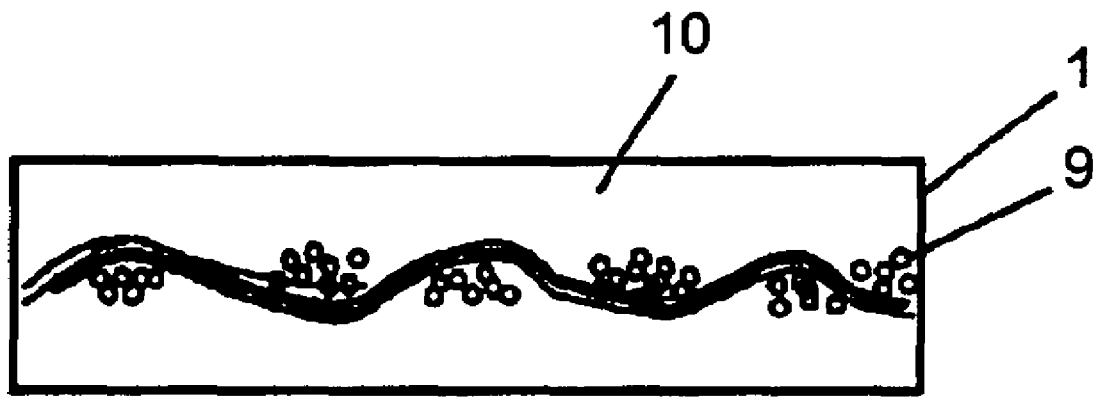
FIG. 4 is a sectional schematic view illustrating materials for manufacturing a circuit-forming board in accordance with a second prior art method.

Next, cut a surplus portion at the periphery to form what is shown in FIG. 2D. Then etch copper foil 5 to form a pattern, thereby forming circuit 7, and finally obtain a four-layer circuit board as shown in FIG. 2E.

In such a method of manufacturing the multi-layer circuit boards, the method of manufacturing the circuit boards and the materials thereof of the present invention can be used, and excellent electrical connections between layers are obtainable.

Double-sided circuit board 11 used in this second embodiment can be a similar one to what is used in the first embodiment; however, a board having layer-to-layer connections formed by an ordinary plating method can be used. Also, a structure, where board material 1 is temporarily press-fitted to double-sided board 11 in the status shown in FIG. 2B, can be used.

A method of manufacturing the multi-layer circuit boards is demonstrated hereinafter. On both the faces of the circuit board shown in FIG. 2A, film 2, board material 1, circuit board 7, board material 1, and film 2 are laminated in this order as shown in FIG. 1A-1G. Then via holes 3 are formed with a laser beam, and conductive paste 4 is filled in via holes 3. Film 2 is then peeled off, and copper foil 5 is disposed outside before heat & pressing are applied.

The prepreg used in the first and the second embodiments is, for instance, ordinary glass-fiber woven fabric or non-woven fabric, either of which is impregnated with thermosetting resin and turned into stage B. Instead of the glass-fiber, an organic fiber such as aramid fiber can be used.

A material made by mixing woven fabric with non-woven fabric, for instance, a material made by sandwiching glass-fiber non-woven fabric between two sheets of glass fibers can be used as a reinforcing member.

The thermosetting resin used in the previous embodiments includes sole resin, thermosetting resin composition made by mixing two or more than two materials, or the thermosetting resin composition modified by thermoplastic resin, such as: epoxy resin, epoxy-melamine based resin, unsaturated polyester based resin, phenol based resin, polyimide based resin, cyanate-system resin, ester cyanate based resin, naphtalene based resin, urea resin, amino resin, alkyd resin, silicone resin, furan nased resin, polyurethane resin, aminoalkyd resin, acrylic resin, fluoro resin, polyphenylene ether resin, ester cyanate resin, and the like. Fire retardant additive or inorganic filler can be added to those resins when necessary.

Instead of the copper foil, a circuit made from metal foil temporarily attached to a supporter can be used.

The conductive paste is used as means for connecting a layer to another layer. The paste is made by mixing conductive particles such as copper powder with thermosetting resin including curing agent. Besides those ingredients, the conductive paste can be made by mixing the conductive particles with polymeric material or solvent of an appropriate viscosity, or can be formed of various combinations of other ingredients. Other than the conductive paste, a conductive projection formed by plating, or conductive particles, not in pasted condition, having a rather large diameter, can be used independently as the means for connecting a layer to another layer.

INDUSTRIAL APPLICABILITY

A manufacturing method of circuit-forming boards and the circuit-forming board are provided. A thickness of board material where connecting means for connecting a layer to another layer are available, is at least equal to and not more than 1.5 times of a thickness of a reinforcing member. This structure allows the connecting means such as conductive paste to connect the layers effectively.

A use of woven fabric, which employs fibers such as glass, as a reinforcing member to prepreg used as board material stabilizes layer-to-layer connection to make full use of advantages such as dimensional stability of the woven fabric and strength of copper foil against being peeled off.

Among the materials for the manufacturing of the circuit boards, an amount of the reinforcing member in the board material is set to range from not less than 30% to not more than 60% in weight ratio, or a thickness of the reinforcing member is set to range from not less than 50% to not more than 90% that of the board material. This structure allows the connecting means such as conductive paste to connect between layers effectively.

As a result, electrical connection between layers with conductive paste increases the reliability, and thus, a quality circuit board of higher density is obtainable.

The invention claimed is:

1. A method of manufacturing a circuit board, the method comprising:
   forming a board material including
   providing a via hole to a prepreg in stage B that has film on both faces thereof,
   filling the via hole with conductive material, said conductive material being constituted by conductive paste including conductive particles and a thermosetting resin component,
   after filling the via hole with conductive material, removing the film from both the faces of the prepreg in stage B; and
   heating and pressing a layered body including the board material;
   wherein the prepreg in stage B includes a thermosetting resin, and a reinforcing member made of fiber and having a thickness $T1$, said reinforcing member having oppositely facing surfaces, and said thermosetting resin forming resin layers on said oppositely facing surfaces of said reinforcing member; and
   wherein said heating and pressing of the layered body involves pressing the prepreg in stage B to a thickness $T2$ by forming a flow-out-section by a flow of the thermosetting resin of the prepreg in stage B, said heating and pressing is carried out such that a thickness ratio $T2/T1$ is maintained in a range from 1 to not more than 1.5 to prevent the conductive particles from flowing laterally along a surface of the board material.

2. The method of claim 1, wherein the prepreg includes the reinforcing member at a weight ratio ranging from more than 30% to not more than 60%.

3. The method of claim 1, wherein a ratio of a thickness of the reinforcing member vs. a thickness of the prepreg ranges from not less than 50% to not more than 90%.

4. A method of manufacturing a circuit board, the method comprising:
   forming a board material including
   providing a via hole to a prepreg in stage B that has film on both faces thereof, said prepreg in stage B comprising thermosetting resin,
   filling the via hole with conductive material, said conductive material being constituted by conductive paste including conductive particles and a thermosetting resin component,
   after filling the via hole with conductive material, removing the film from both the faces of the prepreg in stage B; and
   heating and pressing a layered body including the board material;
   wherein the prepreg in stage B includes a reinforcing member made of fiber and having a thickness $T1$, said reinforcing member having oppositely facing surfaces, and said thermosetting resin forming resin layers on said oppositely facing surfaces of said reinforcing member; and
   wherein said heating and pressing of the layered body involves pressing the prepreg in stage B to a thickness $T2$ such that a thickness ratio $T2/T1$ is maintained in a range from 1 to not more than 1.5 to prevent the conductive particles from flowing laterally along a surface of the board material.

* * * * *